United States Patent [19]

Pastor et al.

[11] Patent Number: 4,857,249
[45] Date of Patent: Aug. 15, 1989

[54] FABRICATION OF RODS OF UNIFORM HIGH DENSITY FROM POWDERS OF REFRACTORY MATERIALS

[75] Inventors: Antonio C. Pastor, Santa Monica; Anthony L. Gentile, Thousand Oaks; Joseph A. Wysocki, Oxnard, all of Calif.

[73] Assignee: Hughes Aircraft Company, Los Angeles, Calif.

[21] Appl. No.: 233,920

[22] Filed: Aug. 16, 1988

Related U.S. Application Data

[63] Continuation of Ser. No. 931,310, Nov. 17, 1986, abandoned.

[51] Int. Cl.$^4$ ............ B28B 11/08; B28B 11/14; B29C 43/00
[52] U.S. Cl. ................... 264/67; 264/1.2; 264/118; 264/157; 264/160; 264/162
[58] Field of Search ............ 264/61, 63, 65, 67, 264/118, 119, 125, 126, 157, 160, 162, 1.2

[56] References Cited

U.S. PATENT DOCUMENTS

| | | | |
|---|---|---|---|
| 2,303,888 | 12/1942 | Miller | 264/67 |
| 3,455,682 | 7/1969 | Barbaras . | |
| 3,520,455 | 7/1970 | Smith | 264/67 |
| 3,717,694 | 2/1973 | Mt. Pleasant, III | 264/67 |
| 3,803,707 | 4/1974 | Passmore et al. | 264/67 |
| 3,886,254 | 5/1975 | Tanaka et al. | 264/65 X |
| 4,138,456 | 2/1979 | Alliegro | 264/65 |
| 4,144,207 | 3/1979 | Ohnsorg | 264/56 X |
| 4,171,400 | 10/1979 | Rosette et al. | 264/320 X |
| 4,233,256 | 11/1980 | Ohnsorg | 264/66 X |
| 4,282,195 | 8/1981 | Hoekje | 264/56 X |
| 4,370,287 | 1/1983 | Thompson | 264/67 |
| 4,421,528 | 12/1983 | Buljan et al. | 264/65 X |
| 4,515,746 | 5/1985 | Brun et al. | 264/332 |
| 4,579,705 | 4/1986 | Matsuoka et al. | 264/63 X |
| 4,606,874 | 8/1986 | Hrovat et al. | 264/56 |

FOREIGN PATENT DOCUMENTS

| | | |
|---|---|---|
| 2311782 | 9/1973 | Fed. Rep. of Germany . |
| 1576752 | 8/1969 | France . |
| 1149347 | 4/1969 | United Kingdom . |

OTHER PUBLICATIONS

Chemical Abstracts, vol. 93, No. 26, Dec. 29, 1980, p. 294, Abstract 244119g, & JP, A,8062855 (National Institute for Research in Organic Materials), May 12, 1980 (Columbus, Ohio).

Journal of Crystal Growth, vol. 36, 1976, North-Holland Publishing Co. (Amsterdam, NL), J. D. Verhoeven et al: "An ARC Floating Zone Technique for Preparing Single Crystal Lanthanum Hexaboride", pp. 115–120, see p. 115, right hand column.

Primary Examiner—Jan H. Silbaugh
Assistant Examiner—Karen D. Kutach
Attorney, Agent, or Firm—Wanda K. Denson-Low

[57] ABSTRACT

Cylindrical rods of titanium carbide or other refractory material with uniform, high density are prepared by hot pressing plates from powders of the material, with a uniaxial pressing pressure applied to the broad faces of the plate. Bars of square cross section are then cut from the plate and machined to cylindrical rods. The process is particularly suited to the preparation of refractory material preforms to be used in single crystal growth by the float zone method. Titanium carbide rods having a highly uniform density of about 96% that of the theoretical maximum can be readily prepared and then grown into titanium carbide crystals.

7 Claims, 2 Drawing Sheets

FABRICATION OF RODS OF UNIFORM HIGH DENSITY FROM POWDERS OF REFRACTORY MATERIALS

This application is a continuation of application Ser. No. 931,310, filed Nov. 17, 1986, now abandoned.

BACKGROUND OF THE INVENTION

This invention relates to the preparation of rods of uniform density from powders of refractory materials, and, more particularly, to the preparation of such rods for use as preforms for growing single crystals of the refractory material.

Single crystals are solids having only a single grain throughout the solid, and are used in a variety of electronic, optical, and other applications. Single crystals have neither internal grain boundaries nor differing internal crystal orientations that cause variations in properties at different locations within the solid, and are normally low in defect and impurity concentrations. For these reasons single crystals exhibit predictable, uniform, and favorable properties throughout their volumes.

Most solids normally are found in a polycrystalline state having many grains, and special care must be taken to prepare single crystals. One of the common methods of preparing large single crystals is to transform a polycrystal rod of a material to a single crystal by the "float zone" method. In one embodiment of this technique, a polycrystalline, cylindrical rod of the material to be transformed is mounted with its cylindrical axis vertical. A local heater having sufficient power to melt a segment of the rod to form a molten zone having a solid piece at either end is positioned around the rod. The heater is then moved upwardly relative to the rod at a precise rate of travel, so that the molten zone progresses along the length of the rod. When the process is properly accomplished, the molten zone solidifies as a single crystal that extends for a portion of the length of the rod. The polycrystalline end pieces are cut off and discarded, and a cylindrical single crystal rod remains.

The polycrystalline rod used as the starting material of the float zone process must be uniformly dense throughout to avoid irregularities in the final single crystal. The rod should also be nearly fully dense so that a relatively low level of emission of gas, or "outgassing", occurs during solidification, and so that a "waist" of reduced section and low mechanical stability is not formed in the molten zone. The rod must also be physically straight and uniform so as to be mountable in the float zone apparatus. These requirements are easily met when the starting rod is a solid piece produced, for example, by casting molten metal into a cylindrical mold. However, many materials such as refractory carbides and nitrides cannot be readily prepared by casting, metalworking, or a like technique that produces a fully solid rod. Such refractory materials usually have high melting points and are sensitive to impurities that make melting and casting difficult or impossible, and there may be no suitable crucible for preparing a melt.

Another approach to providing the polycrystalline rod starting material is to form the rod from a solid powder by a prior fabrication process, thereby producing a "preform" that is then processed to a single crystal by float zoning. There are many different powder processing approaches, and one is currently used in an attempt to prepare refractory material preforms. The refractory material preform is prepared by mixing the appropriate composition of powder with a binder material such as camphor dissolved in alcohol, uniaxially compacting the powder and binder into a cylindrical mold at ambient temperature, enclosing the pressed powder in a rubber envelope and isostatically pressing at ambient temperature, sintering the rod to form a solid with sufficient strength to be handled, and grinding the sintered rod to a cylindrical shape. Alternatively, the powder can be isostatically hot pressed, but this is a costly process.

The techniques presently used to prepare preforms suffer from several shortcomings. It is difficult, if not impossible, to prepare preforms that are fully or nearly fully dense by cold isostatic pressing and subsequent sintering. For some preform materials, such as titanium carbide, the best densities that can be obtained by these methods are about 80% to 85% of the theoretical maximum density. Consequently, about 15% to 20% of the volume of the preform is voids that can absorb gas. The gas is emitted during float zone processing, and the violent outgassing interferes with the single crystal growth and causes instability in the floating zone. Also, compaction of powders in a die normally results in density variations of the compacted powder because of friction between the powder and the die walls. The density variations cause the preform to become bowed upon sintering, so that it cannot be physically fitted into the float zone apparatus.

Thus, while the float zone technique has been proven as a means of preparing single crystals, in certain circumstances it suffers from limitations resulting from the inability to prepare the required preforms from powder. There therefore exists a need for an improved technique for preparing rods from powdered material for use as preforms in float zone growth of single crystals. This need is acute for refractory materials such as titanium carbide, which are not readily prepared as preforms by conventional melting and casting or other direct technique, and instead must be prepared from powders. The present invention fulfills this need, and further provides related advantages.

SUMMARY OF THE INVENTION

The present invention resides in a process for preparing uniformly dense cylindrical rods from refractory material powders, which rods can then be used, for example, as preforms in float zone growth of single crystals. Identically sized rods produced by the present approach typically have densities within 1% of each other, and also have uniform density across the diameter and along the length thereof. The density of the rods is about 96% that of the theoretical maximum density, significantly higher than rods produced from powder by other techniques. Rods of virtually all sizes can be produced with the approach of the invention, and the rods are not warped so as to be unusable in float zone crystal growth. Single crystals grown from the rods have uniform densities throughout, without significant voids and porosity, and there is minimal outgassing and no mechanical instability during crystal growth.

In accordance with the invention, a process for preparing a uniformly dense cylindrical rod having a length greater than its diameter, comprises the steps of furnishing a refractory material powder; hot pressing the powder into a plate having two parallel faces with dimensions greater than the dimension through the thickness of the plate, the plate having at least one face dimension as long as the required length of the rod and a thickness greater than the diameter of the cylindrical rod, the step of hot pressing to occur at elevated temperature and with uniaxial pressing pressure applied parallel to the thickness direction of the plate; cutting bars of the hot pressed material from the plate; and machining the cut bars to a cylindrical form.

In the present approach, rods are produced from powder by first preparing a plate from powder, and then cutting the plate into rectangular bars and machining the bars into cylinders. The significance of this approach is appreciated by contrasting the conventional techniques for preparing rods from powder. In one conventional technique, powder is poured into a cylindrical die, pressure is applied to the ends of the powder mass uniaxially parallel to the cylindrical axis of the die and the rod to compact the powder, and the compacted rod (also termed the "green" rod) is sintered. Frictional forces between the die walls and the powder as it is compacted produce variations in density along the radius and axis of the powder compact. Even when the dies are lubricated, the frictional forces are still sufficiently high to cause undesirable density gradients. Float zone growth of crystals from such rods usually results in a high degree of instability due to outgassing from the rod and to fluctuations in the molten zone diameter, and the crystals thus grown have porosity that varies with radial and axial position along the crystal.

Another approach to preparing rods from powder is to extrude or hot extrude the powder, but again there are porosity and radial and axial variations due to the frictional forces between the die walls and the rod being extruded. Some powders, including many refractory materials such as titanium carbide, may not be extruded because of their low ductilities at low and intermediate temperatures. Yet another approach is hot isostatic pressing (HIP) of powders, wherein powders are placed into a container and then compacted under external isostatic pressure applied in three axes, as by inert gas pressure. Hot isostatic pressing does not result in a high density of powder in the compact when done at low and intermediate temperatures, and is technically difficult and expensive when a high temperature is required to achieve good density.

The process of the present invention uses an entirely different approach to minimize the frictional forces causing the internal density gradients in rods produced from compacted powders. Compacted powder plates are first prepared by hot pressing powders, and then pieces of the plates are processed into a rod form. The hot pressing is uniaxial, with the applied force normal to the broad face of the plate (or alternatively stated, parallel to the through-thickness direction of the plate). Apparatus for applying such a uniaxial pressing pressure is readily available, even for use at hot pressing temperatures of 2000° C. or greater, and is inexpensive compared with isostatic hot presses.

Applying the uniaxial pressure normal to the broad face of the plate results in minimal influence of side frictional forces on the density of the plate. The effects of frictional forces between the powder being compacted and the side walls of the powder pressing die decay with distance into the powder. In the present approach, the length of the side wall of the die in contact with the powder and in the direction parallel to the pressing direction (in which the powder mass moves as it compacts) is small, so that the effects of the frictional forces decay to a negligible level a short distance into the plate. By contrast, the effects of frictional forces extend through the entire volume of a rod produced by uniaxial pressing along the rod axis or by extrusion.

The bar and rod produced by the present process therefore have little density variation along their lengths, since the length lies in the broad face of the plate. That is, all locations along the length of the bar and rod experience essentially the same compaction forces during hot pressing, except for the very ends adjacent the lateral walls. The ends serve as grips during float zone crystal growth, and are usually cut off and discarded. Irregularity in the ends is inconsequential.

While broadly applicable, the process of the present invention is particularly useful in preparing rods from materials that are generally brittle at ambient temperature and have high melting points, and more specifically the refractory materials such as refractory carbides and nitrides. Such materials cannot be formed into dense rods by other techniques, and hot isostatic pressing is particularly expensive.

One such material is titanium carbide, which has a number of applications in the single crystal form. In accordance with the invention, a process for preparing a rod of titanium carbide having a uniform density comprises the steps of furnishing titanium carbide powder; hot pressing the titanium carbide powder into the form of a plate having broad faces of greater dimension than the dimension through the thickness of the plate, said step of hot pressing to occur at elevated temperature and with the pressing pressure applied uniaxially to the broad faces of the plate; cutting bars of square cross section from the plate; and machining the square bars to a cylindrical rod shape. This processing of titanium carbide is preferably accomplished with −325 mesh titanium carbide powder, and at a pressing pressure of about 1700 psi (pounds per square inch) and a temperature of about 2000° C. The resulting hot pressed rods have a density of about 96% that of the theoretical maximum for titanium carbide, while other techniques produce densities of only about 80% that of the theoretical maximum. The rod so produced is unique, in that it is of high and uniform density throughout. The single crystals produced from such a rod preform by float zone growth are also unique, in that they are straight, and of uniform and high density throughout.

It will now be appreciated that the present approach presents an advance in the art of the production of rods by powder metallurgy. The rods have uniform, high densities, and are readily grown into single crystals by float zone growth. Other features and advantages of the invention will be apparent from the following more detailed description, taken in conjunction with the accompanying drawings, which illustrate, by way of example, the principles of the invention.

DETAILED DESCRIPTION OF THE PREFERRED EMBODIMENT

Figure 1:
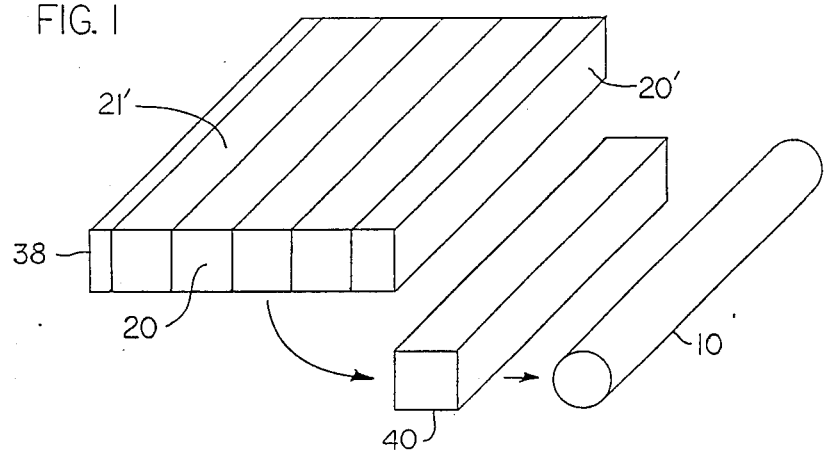
FIG. 1 is a schematic perspective view of a plate prepared from powder, indicating the preparation of a rod from the plate.
Figure 2:
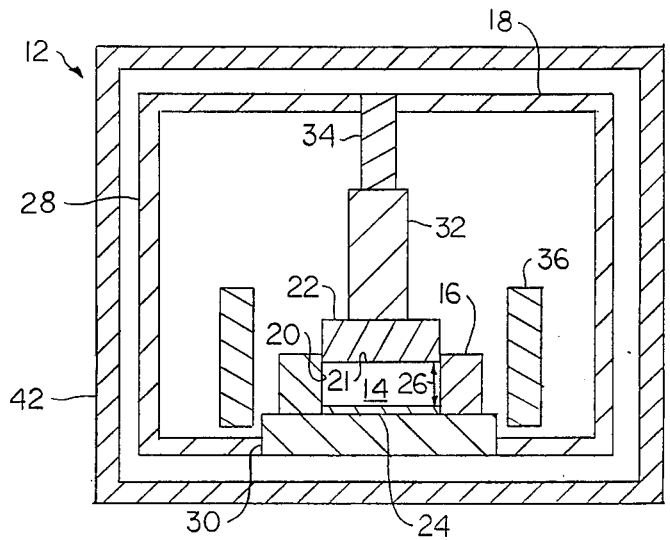
FIG. 2 is a side sectional view of a powder press and die used with the invention.
Figure 3:
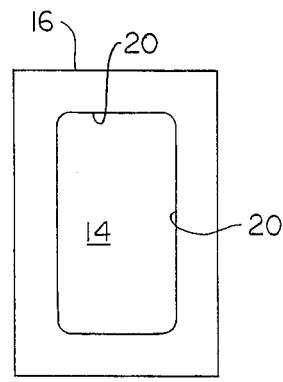
FIG. 3 is a top elevational view of the powder die of FIG. 2.

In accordance with a preferred embodiment of the present invention, a cylindrical rod 10 is produced from titanium carbide powders by the process schematically illustrated in FIG. 1, using hot pressing apparatus 12 of the type depicted in FIG. 2. Titanium carbide powder, or other powders or mixtures of powders appropriate for preparing other types of rods, is placed into a die cavity 14 of a die 16, illustrated in FIGS. 2 and 3, adapted to fit into a hot press 18. The lateral sides 20 of the die cavity 14 define a volume having a broad face 21 which is rectangular or square when viewed from above, and which is closed at the top and bottom by removable platens 22 and 24 which fit into the die cavity 14. The platens 22 and 24 are spaced apart by a separation distance 26 which is much less than the lengths of the sides 20.

Powder is placed into the volume defined by the lateral sides 20, with the upper platen 22 removed. In the preferred embodiment, 99.9% purity titanium carbide powder of −325 mesh size was used. The powder is spread evenly and shallowly across the lower platen 24 to a thickness less than the lengths between the sides 20, but large enough to produce a cylindrical rod of the desired diameter after subsequent hot pressing and machining. The upper platen 24 is inserted, and the die 16, with the powder contained within, is placed into the hot press 18.

The hot press 18 includes a frame 28 and a stationary bed 30 upon which the die 16 rests. A movable ram 32 is oriented vertically over the bed 30, and can move downwardly to press against the top of the upper platen 22. Downward force exerted upon the ram 32 by an hydraulic cylinder 34 reacting against the frame 28 forces the upper platen 22 downwardly, compressing the powder contained in the die cavity 14 by a uniaxial pressure exerted against the broad face 21. For pressing titanium carbide powder, the preferred pressing pressure is about 1700 psi, and the hydraulic cylinder 34 and frame 28 must be capable of applying such pressure over the broad face 21. The pressure is not applied through a side face 20 of the die, although there will be reaction forces against the sides of the die 16. The pressure is not applied in an isostatic fashion, i.e., through movable platens and movable sides simultaneously.

The hot press 18 further includes a heater which heats the die 16 and the powder contained therein to the desired hot pressing temperature. In the illustrated embodiment, the heater is a resistance furnace 36 capable of achieving temperatures of about 2000° C., the preferred hot pressing temperature of titanium carbide powder. The powder within the die cavity 14 is compressed uniaxially while being heated to the desired hot pressing temperature.

The hot press 18 is provided with atmospheric control appropriate to the materials of construction and the type of powder being pressed. In the illustrated embodiment, a vacuum chamber 42 surrounds the hot press and, when pumped to a vacuum of about 10 Torr, provides an environment wherein the contained powder and the apparatus 12 are not oxidized or otherwise damaged during the processing time.

Hot pressing of the powder at 1700 psi and 2000° C. continues for a time sufficient to densify the powder to a desired density, preferably at least about 96% of the theoretical density. The hot pressing time is normally about 30 minutes. The furnace 36 is then turned off and the die 16, with the hot pressed powder contained therein, is removed from the hot press 18 and allowed to cool to ambient temperature. The platens 22 and 24 are then removed, and a plate 38 formed of compressed powders is removed.

The plate 38 has a shape conforming to the inside of the die cavity 14, with a plate broad face 21' and lateral sides 20'. The length of at least one side of the plate 38 in the plane of the broad face 21 is at least as long as the length of the rod 10, and the thickness of the plate in the through-thickness dimension is at least as large as the diameter of the rod 10. In practice, the thickness of the plate is made to be about 105% of the diameter of the rod 10, to account for material loss during machining.

As illustrated in FIG. 1, a substantially square bar 40 is prepared from the plate 38 by making parallel cuts downwardly, with the width of the square bar 40 being about the same as the thickness of the plate 38. A hot pressed titanium carbide plate 38 can be cut with blades impregnated with boron carbide or diamond at the cutting surfaces. The bar 40 is then centerless ground or machined to a cylindrical rod 10.

Upon sectioning and polishing the rod 10, no change in the amount of porosity is seen along the length of the rod or across its diameter. There is about 4% by volume of porosity in a titanium carbide rod processed in the manner indicated, but the porosity is evenly spread throughout the rod 10. The low level of porosity prevents violent outgassing and instability during subsequent float zone crystal growth. The evenness of the porosity prevents warping of the crystal during float zone crystal growth, and also helps to produce a uniform single crystal. A number of rods ½ inch in diameter by 6 inches long, ¾ inch in diameter by 6 inches long, and 1 inch in diameter by 6 inches long have been successfully prepared by this method.

Figure 4:
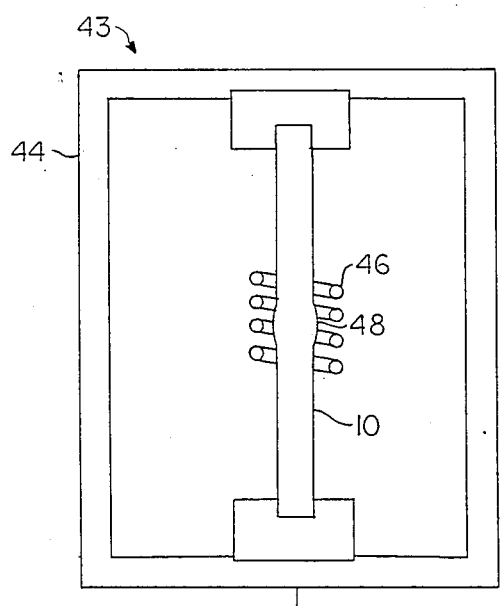
FIG. 4 is a side elevational view, with portions broken away, of a float zone crystal growth apparatus.

Rods prepared by the approach of the present invention have been further processed using a float zone crystal grower 43, schematically illustrated in FIG. 4. A rod 10 is gripped in a vertical orientation at its ends, in a translation frame 44 that can move the rod 10 downwardly while gripping the ends securely and in a fixed relationship to each other. A heater, here illustrated as a radio frequency coil 46, surrounds the rod 10, and heats a portion of the length of the rod 10 throughout its diameter. When a high rf power is applied to the coil 46, the portion of the rod 10 within the coil is heated to a sufficiently high temperature to melt that portion of the rod to form a molten zone 48. The ends of the rod are heated by conduction from the molten zone 48, but the ends are not melted due to the great radiation losses from their exposed surfaces.

After the molten zone 48 is established, the rod 10 is moved downwardly relative to and through the coil 46 by movement of the translation frame 44. (Alternatively, the coil could be moved upwardly to attain the relative motion, or the relative motion could be so as to move the rod upwardly with respect to the coil.) Even though the central portion of the rod 10 is molten, the ends of the rod 10 are rigidly gripped in the frame 44, and the molten zone 48 is not lost. A high degree of porosity of the rod 10 results in outgassing of the molten zone 48 during the crystal growth. The outgassing, if sufficiently violent, can stir the melt and cause instability in the crystal growth. For this reason, it is particularly desirable to have a low level of porosity in the rod preform. The rod preforms of the present invention have only about 4% by volume porosity, resulting in minimum outgassing and disruption of the crystal growth. Further, there is essentially no waist or reduced section of the molten zone during the float zone process, and the zone therefore exhibits good mechanical stability.

As the rod 10 moves relative to the coil 46, the molten zone 48 moves upwardly along the length of the rod 10. It has been found that this type of "float zone" movement results in the growth of a single crystal at the solidifying bottom end of the molten zone 48 as it traverses the length of the rod 10. The linear rate of movement of the rod through the coil is selected as a compromise between several competing factors. A slow growth rate, as about 3 millimeters per hour or less, produces the better quality crystal, but results in increased loss of volatile material and in increased contamination of the crystal. A fast growth rate, as about 10 millimeters per hour or greater, produces a lesser quality crystal, results in less loss of volatile material by outgassing, and results in decreased contamination of the crystal. A compromise growth rate of about 5–6 millimeters per hour has been selected for use. Growth is accomplished in an atmosphere suitable for the crystal being grown. A helium gas pressure of about 400 to about 600 pounds per square inch is used for growing titanium carbide crystals, to suppress loss of the titanium carbide during growth because of its high vapor pressure at the melting point.

The crystals grown from the rods 10 of the invention are uniform in cross section and diameter, and straight. Sections or slices are readily cut from the crystals, and used in electronic and other applications.

The present invention thus results in improved preforms for use in float zone crystal growth, and improved crystals produced by the float zone technique. The density of the preforms is high, reducing instability in the molten zone during growth, and the crystals are relatively free of porosity and straight. Although a particular embodiment of the invention has been described in detail for purposes of illustration, various modifications may be made without departing from the spirit and scope of the invention. Accordingly, the invention is not to be limited except as by the appended claims.

What is claimed is:

1. A process for preparing a uniformly dense cylindrical rod having a length greater than its diameter, comprising the steps of:
   furnishing a refractory material powder;
   hot pressing the powder into a plate having two parallel faces with dimensions greater than the dimension through the thickness of the plate, the plate having at least one face dimension as long as the required length of the rod and a thickness greater than the diameter of the cylindrical rod, said step of hot pressing to occur at elevated temperature and with uniaxial pressing pressure applied parallel to the thickness direction of the plate;
   cutting bars of the hot pressed material from the plate; and
   machining the cut bars to a cylindrical rod form.

2. The process of claim 1, wherein the material of the rod is titanium carbide.

3. A process for preparing a rod of titanium carbide having a uniform density, comprising the steps of:
   furnishing titanium carbide powder;
   hot pressing the titanium carbide powder into the form of a plate having broad faces of greater dimension than the dimension through the thickness of the plate, said step of hot pressing to occur at elevated temperature and with the pressing pressure applied uniaxially to the broad faces of the plate;
   cutting bars of square cross section from the plate; and
   machining the square bars to a cylindrical rod shape.

4. The process of claim 3, wherein the titanium carbide powder is −325 mesh powder.

5. The process of claim 3, wherein the hot pressing temperature is about 2000° C.

6. The process of claim 3, wherein the hot pressing pressure is about 1700 psi.

7. The process of claim 3, wherein the density of the hot pressed plate is about 96% of the theoretical density of the titanium carbide.

* * * * *